United States Patent [19]

Shaw et al.

[11] 4,069,094

[45] Jan. 17, 1978

[54] METHOD OF MANUFACTURING APERTURED ALUMINUM OXIDE SUBSTRATES

[75] Inventors: Joseph Michael Shaw, Cranbury; Karl Heinz Zaininger, Princeton, both of N.J.

[73] Assignee: RCA Corporation, New York, N.Y.

[21] Appl. No.: 755,968

[22] Filed: Dec. 30, 1976

[51] Int. Cl.² .......................................... H01L 21/205
[52] U.S. Cl. ............................. 156/612; 29/576 E;
29/576 T; 148/175; 156/644; 156/645;
156/656; 156/657; 156/662; 156/667; 156/613;
156/DIG. 61; 156/DIG. 73; 427/95; 427/255
[58] Field of Search ............... 156/612, 613, 628, 644,
156/645, 654, 649, 655, 657, 662, 667, 656, 614,
650, DIG. 61, DIG. 73; 29/571, 578, 576 E,
576 T; 148/175; 427/87, 255, 95

[56] References Cited

U.S. PATENT DOCUMENTS

| 3,272,670 | 9/1966 | Myers | 156/667 |
|---|---|---|---|
| 3,496,037 | 2/1970 | Jackson et al. | 148/175 |
| 3,661,676 | 5/1972 | Wong et al. | 156/612 |
| 3,698,947 | 10/1972 | Kemlage et al. | 156/657 |
| 3,740,280 | 6/1973 | Ronen | 156/645 |
| 3,766,637 | 10/1973 | Norris et al. | 29/571 |
| 3,861,968 | 1/1975 | Magdo et al. | 148/175 |
| 3,878,005 | 4/1975 | Warren et al. | 156/667 |

*Primary Examiner*—William A. Powell
*Assistant Examiner*—Jerome W. Massie
*Attorney, Agent, or Firm*—H. Christoffersen; T. H. Magee

[57] ABSTRACT

A method for making an apertured aluminum oxide substrate by selectively masking a sapphire wafer, depositing aluminum oxide adjacent the wafer and the mask, and removing the aluminum oxide deposited adjacent the mask and the mask, whereby an aperture is formed in the aluminum oxide. A composite is thus formed of an insulating substrate of monocrystalline sapphire with an insulating epitaxial layer of aluminum oxide apposed thereto, the epitaxial layer having an aperture therein which may be filled with an island of epitaxial silicon.

8 Claims, 11 Drawing Figures

METHOD OF MANUFACTURING APERTURED ALUMINUM OXIDE SUBSTRATES

The Government has rights in this invention pursuant to Contract No. F19628-73-C-0146 awarded by the Department of the Air Force.

This invention is related to methods for forming apertured insulating substrates consisting of sapphire, aluminum oxide or the like. Specifically, the novel invention is directed to a method for fabricating a substrate of aluminum oxide, i.e. sapphire, comprised of an epitaxial monocrystalline layer appositioned to a monocrystalline insulating wafer wherein blind apertures are formed by depositing the epitaxial aluminum oxide over and around a selectively deposited mask adjacent the wafer and subsequently forming a composite comprising islands of epitaxial silicon within the apertures.

As known, a masking layer such as silicon dioxide or magnesium chloride may be used to define a pattern of openings for the growth of epitaxial semiconductor material in small, limited areas on a body of semiconductor material. The masking layer is removed and the insulating structure used in the fabrication of integrated circuits. See, for example, U.S. Pat. No. 3,409,483, issued Nov. 5, 1968 to J. F. Watson.

As known, a process is available for fabricating semiconductor devices in which a patterned oxide film of a predetermined thickness is formed on a semiconductor substrate followed by epitaxially forming on exposed areas of the substrate a layer of semiconductor material having a preselected thickness relative to the thickness of the oxide. See, for example, U.S. Pat. No. 3,615,929 issued Oct. 26, 1971, to William M. Portnoy et al.

Furthermore, it is known that there exists a method for growing semiconductor material on insulating or conducting substrates or in small apertures in insulating or conducting substrates by masking the surface of a nucleating semiconductor substrate with an appropriately apertured mask, epitaxially growing semiconductor material through the apertures and separating the mask with its grown semiconductor material from the nucleating substrate to produce either discrete crystals on a substrate or a crystal wafer.

Although the growth of single or polycrystalline material such as silicon or germanium over the surface of a semiconductor substrate by the epitaxial process is known in the art, it is not heretofore known that aluminum oxide may be simultaneously deposited as polycrystalline aluminum oxide adjacent an insulator such as silicon dioxide and as monocrystalline aluminum oxide or sapphire. The growth of discrete crystals of semiconductor material such as silicon by the iodine transport process is, however, known in the art. See, for example, U.S. Pat. No. 3,634,150 issued Jan. 11, 1972 to F. H. Horn (deceased).

A major problem in the processing of silicon-on-sapphire semiconductor devices has been the electrical instabilities introduced into the electrical characteristics of the silicon-on-sapphire devices by junctions formed on the edges of the mesas as made on the sapphire substrate. One way of eliminating problems associated with the edge regions of the silicon mesas is to bury or imbed the mesas in the sapphire substrate.

One prior art method for imbedding a silicon mesa in a sapphire substrate has been to ion beam mill a hole of appropriate size adapted to receive the epitaxial layer of silicon therein. This method has the disadvantage of being expensive and unsuited for mass production of silicon-on-sapphire devices. Thus, an effective and efficient as well as economical means for manufacturing apertures in sapphire which are adapted for growth of monocrystalline epitaxial silicon therein is needed.

There exists a planar silicon technology wherein silicon transistor devices are manufactured in bulk intrinsic silicon wafers by selectively diffusing impurities in selected areas of the wafer. This technology has several drawbacks and disadvantages which are cured by forming the silicon device on a substrate which insulates the devices from other devices so formed on the same substrate.

Figure 1:
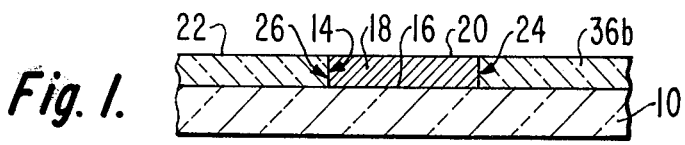
FIGS. 1-7 are a series of cross-sectional views illustrating selected steps in the present method.

FIG. 1 shows a composite which may be produced by the method of the novel invention. There is shown a sapphire substrate 10 having an epitaxial layer 36b of aluminum oxide in apposition thereto. The epitaxial layer 36b of aluminum oxide is selectively apertured as at 14. The aperture 14 is adapted to receive an epitaxial growth of silicon onto a surface 16 of the substrate 10. The epitaxial growth of silicon forms an island 18 of silicon, for example, which complements the aperture 14. The island 18 has a major surface 20 which is preferably co-planar with a major surface 22 of the epitaxial layer 36b. The island 18 has at least sidewalls 24 and 26 transverse to the surface 16 of the substrate 10. The semiconductor island 18 is epitaxially grown such that its sidewalls 24 and 26 are contiguous with the aperture 14 of the epitaxial layer 36b of aluminum oxide.

As shown in FIG. 1, the sidewalls 24 and 26 of the semiconductor island 18 are not available for diffusion thereinto because of the novel arrangement in FIG. 1 wherein they are imbedded in the deposited monocrystalline insulating material comprising the epitaxial layer 36b, of monocrystalline aluminum oxide in this case. In one application, for example, a field effect transistor may be formed in the island 18 merely by placing impurities in the island through the major surface 20 thereof.

The composite of FIG. 1 is also useful in the manufacture of integrated circuits wherein a plurality (not shown) of the silicon islands such as island 18 are formed adjacent the substrate 10 and interconnected by metal strips placed adjacent the epitaxial layer 36b of aluminum oxide. Another advantage of the composite shown in FIG. 1 is that it is possible to grow monocrystalline silicon interconnections for adjacent islands such as island 18 and to achieve less resistivity per unit volume for interconnections than would be achieved by the use of polycrystalline silicon if the layer 36b were comprised of silicon dioxide or some other noncrystalline insulating material. This low resistivity results because the ordered structure of monocrystalline silicon provides greater charge carrier mobility than equivalently doped polycrystalline silicon.

If the layer 36b were intrinsic epitaxial silicon subsequent source and drain diffusions could only be restricted to the island 18 if the layer 36b were appropriately masked. Thus, an additional masking step would be required, increasing the cost and, presumably, adversely affecting the yield for such devices.

Figure 2:
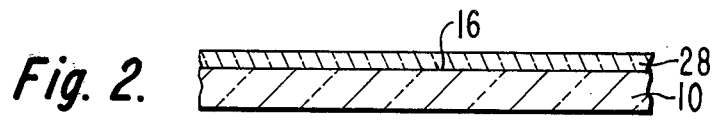

The present process of making the composite of FIG. 1 is illustrated in FIGS. 2-7. FIG. 2 shows the substrate 10 with a layer 28 of silicon dioxide or a physico-chemically equivalent material on the surface 16 thereof. The layer 28 of silicon dioxide is preferably formed by placing the substrate 10 of sapphire in a reactor chamber (not shown) wherein silane (SiH$_4$) is permitted to react with oxygen at a temperature of about 900° C. A layer 28 having a thickness of approximately 1000 Angstroms may be deposited from a reaction lasting approximately 15 minutes at this temperature. The thickness of the layer 28 is not critical to the present invention.

Figure 3:
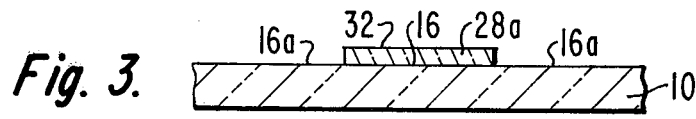

The layer 28 is next photolithographically defined, for example, by providing a layer of photo-resist (not shown) thereon and selectively exposing the resist to form a mask. The unmasked portions of the layer 28 are then removed, as by etching in any suitable solvent, to leave a masking portion 28a adjacent the sapphire substrate 10 as illustrated in FIG. 3. The layer 28 may be etched, for example, with buffered hydrofluoric acid at a temperature of 23° C, for about 3 minutes. The masking photoresist may be any one of several known resists such as Kodak KTFR photoresist.

The substrate 10 is formed with the surface 16 thereof substantially parallel to the [1012] plane of the sapphire.

In FIG. 3 is shown an intermediate wafer wherein the mask 28a has a non-contiguous surface 32 and the substrate 10 has a non-contiguous surface 16a.

The next step in the process (FIG. 4) is to deposit a layer 36 of aluminum oxide (Al$_2$O$_3$) on the non-contiguous surfaces 32 and 16a of the mask 28a and the substrate 10, respectively. A portion 36a of the layer 36 of aluminum oxide is deposited as polycrystalline aluminum oxide, whereas a portion 36b of the layer 36 of aluminum oxide is deposited adjacent the surface 34 of the substrate 10 as monocrystalline aluminum oxide. This result occurs, for example, when the aluminum oxide is grown by epitaxy.

Figure 8:
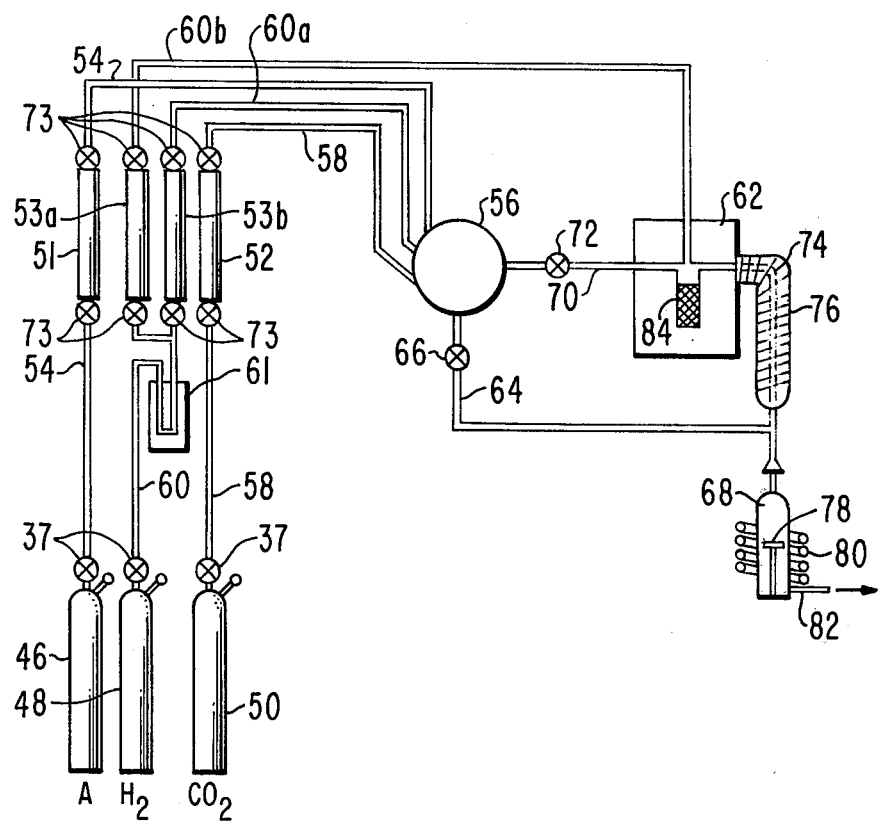
FIG. 8 is an illustration of an apparatus adapted for epitaxially depositing aluminum oxide.

FIG. 8 is a schematic drawing of an apparatus for carrying out the epitaxial deposition of the aluminum oxide (Al$_2$O$_3$) layer 36. The apparatus comprises three valves 37, three gas tanks 46, 48 and 50, each having a valve 37 and containing argon, hydrogen and carbon dioxide, respectively. The tanks 46 and 50 are connected to suitable flowmeters 51 and 52, respectively. The tank 48 is connected to suitable flowmeters 53a and 53b. The argon tank 46 has a line 54 leading to a mixing chamber 56 via the flowmeter 51. The carbon dioxide tank 50 has a line 58 leading to the chamber 56 via the flowmeter 52. The hydrogen tank 48 has a line 60 leading through a cold trap 61 and then into a branch line 60a leading to the mixing chamber 56 and another branch line 60b leading into a means 62 for sublimating aluminum chloride. A line 64 leads from the mixing chamber 56 through a valve 66 to a quartz reaction tube 68. A line 70, containing a valve 72, connects the mixing chamber 56 and the sublimator 62. Each flowmeter 51, 52, 53a and 53b interconnects to valves 73.

At the exit side of sublimator 62 is a pipeline 74 surrounded by a heater 76. The line 74 also leads to the reaction tube 68.

Inside the reaction tube 68 is a pedestal or susceptor 78. Outside the reaction tube 68 is a conventional RF heater coil 80 connected to an RF generator (not shown). Leading from the reaction tube 68 is a vent 82.

In carrying out the steps of the novel method wherein the aluminum oxide is deposited, the sapphire substrate 10 at the manufacturing stage shown in FIG. 3 is placed on the pedestal of the susceptor 78 and inserted within the reaction tube 68.

The system is then flushed with argon from the tank 46 for several minutes. The argon passes through the line 54 to the mixing chamber 56 from which it proceeds through the line 70 to the sublimator 62 and thence through line 74 to the reaction tube 68. It also proceeds from the mixing chamber 56 through the line 64.

The wafer 30 having the mask 28a attached is preferably heated to 950° C by the RF heater coil 80. However, the heating temperature may be varied within a range of about 875° C and 990° C. With argon gas still flowing, hydrogen is permitted to flow from the tank 48. The hydrogen flow is adjusted to about 2700 cc/min. and the temperature is permitted to stabilize for 5–10 minutes. When the hydrogen flow is established, the argon flow is shut off.

Meanwhile, aluminum trichloride in solid form is placed within a flask 84 within the sublimator 62 prior to deposition and the flask 84 is heated at a temperature high enough to obtain a sufficient partial pressure of the aluminum trichloride. Aluminum trichloride has a vapor pressure of approximately 10 mm. at a temperature of about 125° C. Hydrogen flowing through the line 60 to the sublimator 62 picks up the aluminum trichloride vapor and carries it through the heated tube 74 into the reaction tube 68. The tube 74 is heated so that aluminum trichloride does not condense on its wall before reaching the reaction tube. The hydrogen, laden with aluminum trichloride vapor, is adjusted to a flow rate of about 350 cc./min. Hydrogen also flows through line 54 to the mixing chamber 56 where it is mixed with carbon dioxide.

The carbon dioxide flows through line 58 to mixing chamber 56 and is adjusted to a flow rate of about 20 cc./min.

The chemical reaction which occurs is as follows:

$$2 AlCl_3 + 3H_2 + 3CO_2 \rightarrow Al_2O_3 + 6HCl + 3CO$$

The hydrogen and carbon dioxide react to form water and carbon monoxide, and the water (vapor) reacts with the AlCl$_3$ to form Al$_2$O$_3$ and HCl.

It has been found that there is an incubation period of about 30 seconds before an Al$_2$O$_3$ film begins to deposit on the substrate 10 and mask 28a. A growth rate of 75–100 Angstroms per minute is preferably maintained, but this can be more widely varied between about 50 and 125 Angstroms per minute.

When the desired thickness of Al$_2$O$_3$ has been obtained, the deposition is terminated by simultaneously shutting off the AlCl$_3$ — hydrogen carrier flow and the CO$_2$ flow.

Next, the Al$_2$O$_3$-coated wafer 30 is annealed for about 20 minutes in hydrogen at the growth temperature of 950° C. The annealing time should not be less than about 10 minutes and can be much longer than 20 minutes, but there is little benefit from using longer times.

Following the annealing step, the wafer 30 is permitted to cool slowly at a temperature decrease of 20°–25° C/min. (or slower) until, after about 20 minutes or so, a temperature of 300°–400° C is reached. The slow cooling takes place in the hydrogen atmosphere. There does not appear to be any additional benefit from cooling at a rate slower than 20° C/min., although a slower rate is not detrimental.

When the temperature has dropped to 300°–400° C, the RF power is turned off and the wafer is allowed to cool more rapidly to room temperature. Agron gas is then substituted for hydrogen and the wafer is removed from the reaction tube 68 for further processing. The gas line 64 may be used to assist flushing operations.

Further aspects of the above processing steps for the deposition of aluminum oxide onto the substrate 10 may be found in U.S. Pat. No. 3,766,637 issued Oct. 23, 1973 to Norris et al., and such patent is hereby incorporated herein by reference.

Figure 4:
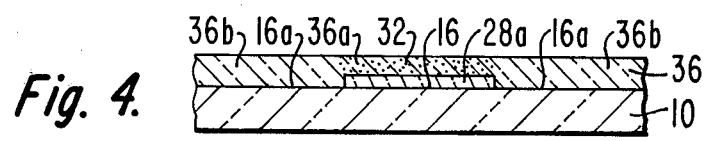
Figure 5:
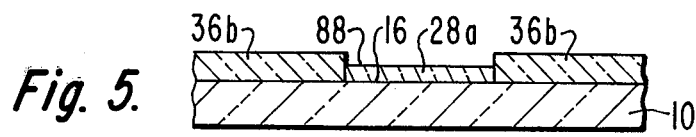

Additional processing includes immersion of the structure shown in FIG. 4 into a bath of phosphoric acid ($H_3PO_4$) maintained at a temperature of approximately 180° C for a period of approximately 3 minutes. This step removes the polycrystalline aluminum oxide portion 36a and permits the portion 36b of the layer 36 to remain. See FIG. 4. The resultant structure is shown in FIG. 5. There, the mask 28a is surrounded by at least one portion 36b of the aluminum oxide layer 36 supported by the substrate 10. The mask 28a exhibits a non-contiguous surface 88.

Figure 6:
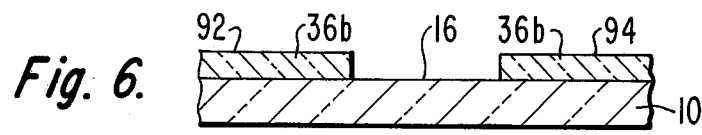

Subsequently, as shown in FIG. 6, the mask 28a is removed by any suitable known means such as, for example, buffered hydrofluoric acid, at a temperature of approximately 23° C for a period of five minutes, for example. The resultant structure is next cleaned.

Figure 7:
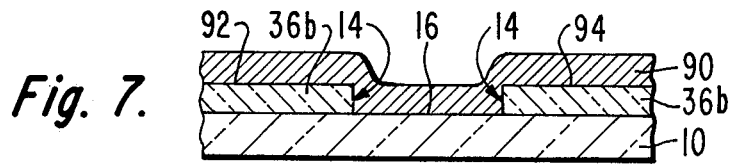

After thoroughly cleaning and drying the structure as shown in FIG. 7, a layer 90 of monocrystalline epitaxially-grown silicon is deposited adjacent the non-contiguous surfaces 92, 94 and 16 to form the structure shown in FIG. 7. Additionally, layer 90 of monocrystalline silicon during deposition is deposited into an aperture 14 in the layer 36 such that the aperture 14 is filled with monocrystalline silicon epitaxially grown from the surface 16 of the substrate 10.

Reaction tube 68 may now be purged with a purging gas such as argon and evaporated to a pressure of $10^{-5}$ mm of mercury. The heater element 80 may now be energized and the structure heated to a temperature in the range of 800°–1400° C. The monocrystalline layer 90 may be deposited either from pyrolysis of silane ($SiH_4$) in hydrogen at the elevated temperature of 800°–1400° C or the silicon or other similar semiconductor material may be deposited from a source body (not shown) preferably maintained at a temperature of approximately 100° C below the substrate temperature. The silicon is epitaxially deposited or grown from the source body by reaction with a halide vapor in the reaction tube 68.

The portions of the layer 90 which extend above the surfaces 92 and 94, exclusive of the monocrystalline silicon island in the aperture 14, are next removed by a suitable means such as, for example, polishing or grinding to achieve a structure similar to that shown in FIG. 1.

Figure 9:
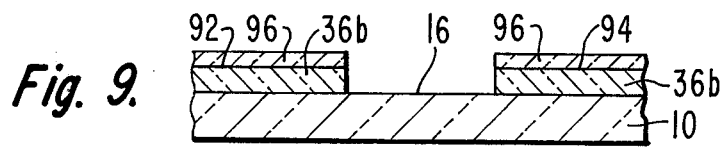
FIGS. 9-11 are a series of cross-sectional views illustrating further selected steps in the present method.
Figure 10:
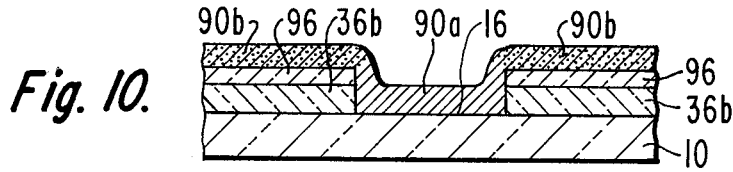
Figure 11:
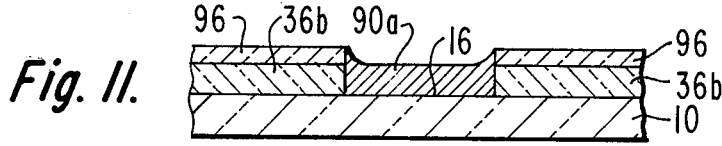

It is also to be understood that the structure shown in FIG. 6 may be appropriately masked such that the surfaces 92 and 94 are selectively covered with a coating 96 of the silicon dioxide (See FIG. 9). A layer of silicon dioxide grown adjacent the structure, modified as described, results in the epitaxial growth of monocrystalline silicon 90a only from the surface 16 and the growth of polycrystalline silicon 90b from the coated surfaces 92 and 94 (See FIG. 10). This facilitates defining the island 18 shown in FIG. 1 by taking advantage of the greater etch rate of the polycrystalline silicon 90b over that of the single crystalline material (see FIG. 11). Subsequently, the added coating 96 of silicon dioxide is removed such as by immersion in a bath of phosphoric acid at a temperature of 180° C to produce the structure shown in FIG. 1.

What we claim is:

1. A method for making a planar composite of a monocrystalline silicon island imbedded in aluminum oxide comprising the steps of:
   selectively masking a sapphire wafer with a mask of silicon dioxide or a physico-chemical equivalent material,
   depositing substantially monocrystalline aluminum oxide on said wafer,
   simultaneously depositing polycrystalline aluminum oxide on said mask,
   contacting the aluminum oxide deposited on said mask and said wafer with hot phosphoric acid ($H_3PO_4$), whereby said polycrystalline aluminum oxide is removed by etching but said substantially monocrystalline aluminum oxide remains intact,
   removing the mask, whereby the wafer is selectively exposed by an aperture in the aluminum oxide deposited on the wafer,
   depositing monocrystalline silicon into the aperture and on a non-contiguous surface of the deposited aluminum oxide, and
   removing a portion of said deposited silicon which extends above the deposited aluminum oxide whereby a monocrystalline silicon island remains imbedded in the deposited aluminum oxide.

2. A method for making an apertured aluminum oxide layer on a substrate comprising the steps of:
   selectively masking a portion of a surface of a sapphire wafer with a mask of silicon dioxide or a physico-chemical equivalent material,
   depositing polycrystalline aluminum oxide on said mask and substantially monocrystalline aluminum oxide on the unmasked portion of said wafer,
   contacting the aluminum oxide deposited on said mask and said wafer with hot phosphoric acid ($H_3PO_4$), whereby said polycrystalline aluminum oxide is removed by etching but said substantially monocrystalline aluminum oxide remains intact, and
   removing the mask, whereby the surface of the wafer is selectively exposed by an aperture in the aluminum oxide deposited on the wafer.

3. A method according to claim 1, wherein the hot phosphoric acid is at a temperature of approximately 180° C.

4. A method according to claim 3, wherein the aluminum oxides are grown at a temperature between 875° and 990° C.

5. A method according to claim 4, wherein the aluminum oxide depositions occur at a rate between 50 and 400 Angstroms per minute.

6. A method according to claim 5, wherein the aluminum oxides are deposited from pyrohydrolysis of aluminum trichloride, hydrogen and carbon dioxide.

7. A method according to claim 6, wherein the deposited aluminum oxides are annealed at growth temperatures in hydrogen or a physico-chemically equivalent material for at least 10 minutes, and the annealed oxides are then slow-cooled in said hydrogen or said material until the temperature decreases to about 300° to 400° C.

8. A method according to claim 7, in which said slow cooling is at a rate of 20°–25° C per minute.

* * * * *